United States Patent [19]

Jucha et al.

[11] Patent Number: 4,997,520

[45] Date of Patent: Mar. 5, 1991

[54] METHOD FOR ETCHING TUNGSTEN

[75] Inventors: Rhett B. Jucha, Celeste; Cecil J. Davis, Greenville; Duane Carter, Plano; Jeff D. Achenbach, Garland, all of Tex.

[73] Assignee: Texas Instruments Incorporated, Dallas, Tex.

[21] Appl. No.: 204,821

[22] Filed: Jun. 10, 1988

[51] Int. Cl.⁵ .............................................. C23F 1/02
[52] U.S. Cl. ..................................... 156/643; 156/646; 156/651; 156/656; 156/664; 204/129.32; 204/192.35
[58] Field of Search ............... 156/643, 664, 656, 646, 156/650, 659.1, 651; 204/129.1, 129.65, 192.32, 192.35

[56] References Cited

U.S. PATENT DOCUMENTS

| | | | |
|---|---|---|---|
| 4,517,225 | 5/1985 | Broadbent | 156/664 |
| 4,617,087 | 10/1986 | Iyer et al. | 156/664 |
| 4,671,847 | 6/1987 | Clawson | 156/646 |
| 4,678,593 | 7/1987 | Tomita et al. | 156/643 |
| 4,698,130 | 10/1987 | Restall et al. | 156/664 |
| 4,705,593 | 11/1987 | Haigh et al. | 156/643 |
| 4,786,360 | 11/1988 | Cote et al. | 156/667 |
| 4,804,560 | 2/1989 | Shioya et al. | 156/664 |
| 4,836,886 | 6/1989 | Daubenspeck et al. | 156/664 |
| 4,836,887 | 6/1989 | Daubenspeck et al. | 156/664 |
| 4,842,683 | 6/1989 | Cheng et al. | 156/643 |

OTHER PUBLICATIONS

Franssila, Sami "Tungsten Dry Etching in Medium Pressure Single Wafer Etcher", May, 1988.
Burba et al., "Selective Dry Etching of Tungsten for VLSI Metallization", Oct. 1986, Journal of the Electrochemical Society.

Primary Examiner—David A. Simmons
Assistant Examiner—Thi Dang
Attorney, Agent, or Firm—Gary C. Honeycutt; Melvin Sharp; N. Rhys Merrett

[57] ABSTRACT

A method for etching a tungsten film which includes introducing activated species of a halogenated hydrocarbon to the tungsten film.

10 Claims, 2 Drawing Sheets

METHOD FOR ETCHING TUNGSTEN

CROSS REFERENCE TO RELATED CASES

The present application is related to copending U.S. patent applications Ser. Nos. 074,375 and 074,415, filed July 16, 1987, now U.S. Pat. Nos. 4,874,723 and 4,910,043, respectively, and Ser. No. 122,605, filed Nov. 17, 1987, now U.S. Pat. No. 4,842,676.

BACKGROUND OF THE INVENTION

1. Field Of The Invention

The present invention relates to a method of manufacturing integrated circuits and other electronic devices. More particularly, the invention relates to an improved process for the forming and etching of tungsten containing film on a semiconductor wafer.

2. Description Of The Related Art

Refractory metals such as chemical vapor deposited tungsten have been identified as suitable interconnect material for VLSI/ULSI applications. As interconnect dimensions shrink to the micron and submicron range, sputtered materials become unsuitable for the needs of high density, high speed devices. Chemical vapor deposited tungsten is finding applications in the area of gate and interconnect technology due to its electromigration resistance, excellent step coverage, and because its thermal expansion is similar to that of silicon. Chemical vapor deposited tungsten also withstands higher process temperatures and does not form hillock as will aluminum.

In the past hard masks and hard stopping layers have been used to manufacture semiconductor devices with chemical vapor deposited tungsten interconnects. A manufacturable etch process, however, must use photoresist as the mask and be able to stop on oxide while allowing long overetches to occur. The etchant must be selective to both photoresists and oxide and have good critical dimension control. Additionally, the typical chemical vapor deposited tungsten film is topologically very rough, usually 25% or more of the film thickness and therefore puts more emphasis on a selective etchant than in the case of a smoother sputtered film.

Chemical vapor deposited tungsten forms a volatile fluoride product, as does silicon dioxide. Thus, it becomes very difficult to achieve selectivity between the two films. Chlorine-based chemistries and oxychlorides have been successful in etching tungsten with selectivity to oxide. These chemistries, however, tend to erode an organic mask, e.g. a photoresist, at the same rate as that of the tungsten which makes it difficult to the process the thick chemical vapor deposited tungsten with submicron geometries. The height-to-minimum geometry aspect ratio of the starting photoresist layer would most likely have to exceed 2:1. The use of one micron or smaller chemical vapor deposited tungsten for metal interconnects has made it necessary to develop a two step process that encompasses all of the necessary selectivities and critical dimension control and a process which makes tungstens interconnects truly manufacturable. It is also necessary to achieve sufficient selectivity between chemical vapor deposited tungsten and oxide.

SUMMARY OF THE INVENTION

Described herein is a method for etching a tungsten film, comprising, introducing activated species of a halogenated hydrocarbon to the tungsten film.

It has also been found useful to generate the activated species using at least one electromagnetic energy source taken from the group consisting of radio frequency energy, electron cyclotron resonance, chemically assisted ion beam, ion beam cluster, magnetron enhanced, LASER, x-ray, ultraviolet, and visible light.

Also described herein is another useful embodiment of a process for etching of a tungsten film which comprises the steps of: removing tungsten from unmasked areas of a workpiece using a first etchant that removes tungsten at a greater rate than it removes photoresist; and removing tungsten from unmasked areas of the workpiece using a second etchant that removes tungsten at a greater rate than it removes silicon dioxide.

It has been found useful in performing the above process to generate the first etchant from a gas comprised of, for example, fluorine, bromine and halogenated hydrocarbon and the second etchant from a gas comprised of species of fluorine, bromine and chlorine.

It has also been found useful to generate the first etchant using at least one electromagnetic energy source taken from the group consisting of radio frequency energy, electron cyclotron resonance, chemically assisted ion beam, ion beam cluster, magnetron enhanced, LASER, x-ray, ultraviolet, and visible light. The second etchant is usefully generated using a combination of the aforementioned energy sources and activation using a plasma generator remote from the process chamber.

The advantages are set forth within and toward the end of the description of the preferred embodiment.

BRIEF DESCRIPTION OF THE DRAWINGS

The present invention will be described with reference to the accompanying drawings, wherein.

In the figures, the sizes and dimensions of various parts are exaggerated or distorted for clarity of illustration and ease of description.

DESCRIPTION OF THE PREFERRED EMBODIMENT

The first embodiment of the present invention can be practiced using any semiconductor processing module which is capable of generating activated species from a feed gas (e.g., relatively high power reactive ion etch). Activated species include free radicals, ions and energetic atomic species. Many devices capable of producing activated species are currently available in including those that use radio frequency energy, electron cyclotron resonance, chemically assisted ion beam, ion beam cluster, magnetron enhanced, LASER, x-ray, ultraviolet, and visible light.

Figure 1:
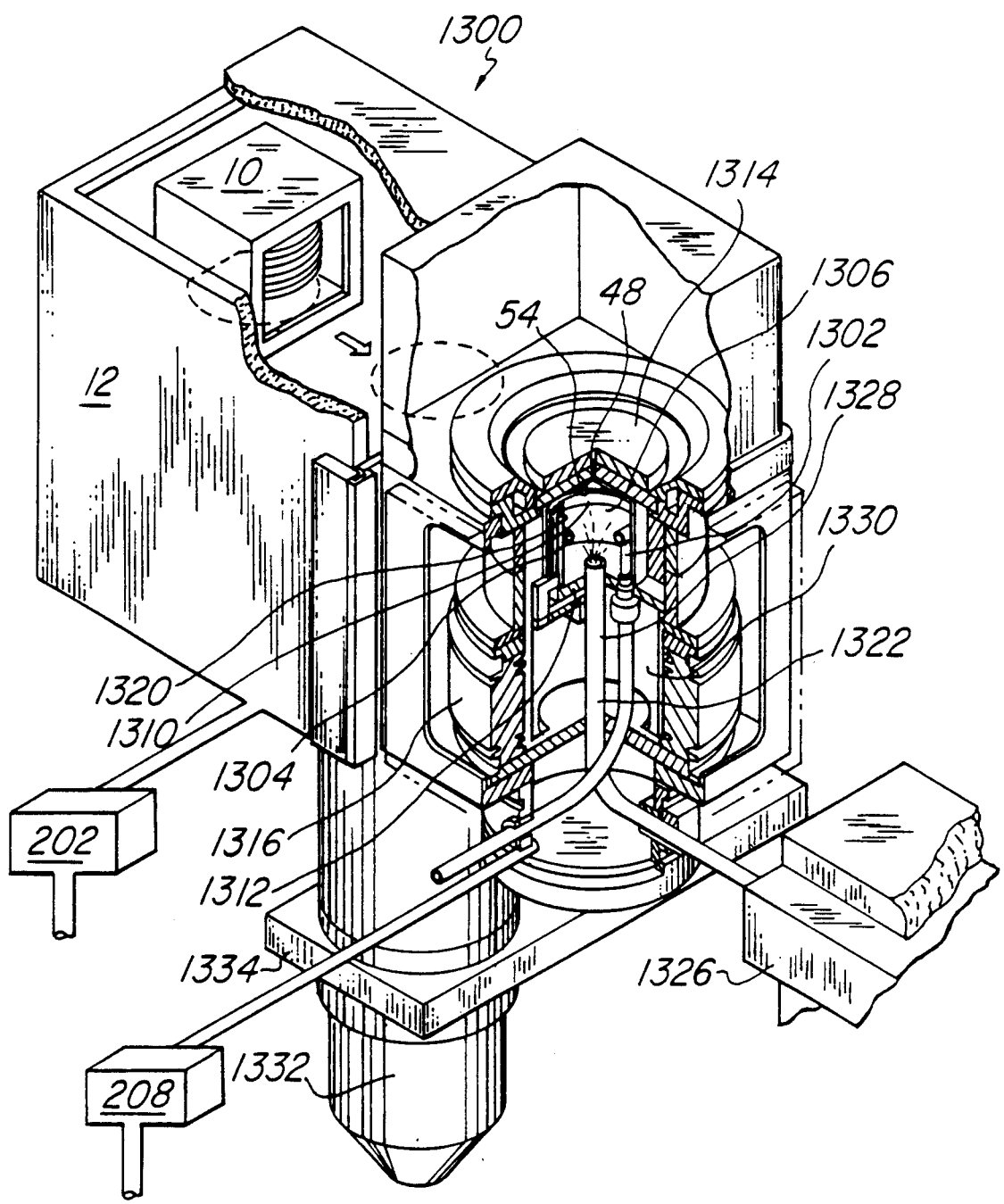
FIG. 1 shows a process module having the capability to produce both an in situ plasma and provide activated species from a remote plasma generator for performing the present invention.

The first embodiment could be practiced using, for example, a processing module described in U.S. patent application Ser. No. 074,415, filed July 16, 1987, which is incorporated by reference, or any other process module capable of providing plasma products, i.e. predominantly free radicals, and generating activated species from those free radicals or from another feed gas. An example of a processing module that can be used to perform this process is shown in FIG. 32 of that application and is described in the specification. FIG. 1 of this application is identical to FIG. 32 of the incorporated patent application and shows a process module having the capability to produce both an in situ plasma and to provide free radicals from a remote plasma generator for performing the present invention.

Referring to FIG. 1, a process module 1300 is shown. This process module has remote and in situ plasma capability. The wafer carrier 10, a transfer arm (not shown) and chamber 12 are utilized to transfer the wafer 48 from the carrier 10 to the process module 1300. Module 1300 is shown with a gas distributor 1302 attached to a gas distribution ring 1304 which is located in the upper part of top process chamber 1306. The gas distributor 1304 can supply a second gas mixture to the process module. The ring 1304 is arranged about the vertical axis of the chamber 1306. The gas exits from ring 1304 through a plurality of openings 1310 in the bottom of ring 1304. The vertical walls of chamber 1306 can be made of quartz and form a cylinder about the vertical axis of chamber 1306. The bottom of chamber 1306 is an electrode 1312. The top of chamber 1306 in the closed position is an electrode 1314. A heat exchanger (not shown) can be provided for electrode 1314, if desired, for example, to maintain an ambient temperature of, for example, 25 degrees C.

Bellows 1316 opens and closes chamber 1306. Bellows 1306 moves the vertical walls of chamber 1306 upward and into contact with the electrode 1314 or an adjacent portion of module 1300. A seal (not shown) can be provided at the location where the vertical wall of chamber 1306 comes into contact with electrode 1314 or an adjacent portion of module 1300. The bellows moves the chamber 1306 upward to close the chamber and downward to open the chamber. In the open position the arm can transfer the wafer 48 from the carrier through chamber 12 and into the chamber 1306 onto fingers or pins 1320. When the chamber 1306 is closed, the fingers 1320 move upward to place the wafer 48 into contact with electrode 1314.

The remote plasma is supplied into the bottom of chamber 1306 along the vertical axis through a pipe 1322. Pipe 1322 extends from a remote plasma generator 1326 and through electrode 1312 into chamber 1306. The pipe 1322 has a slip fit 1328 with electrode 1312 to accomodate the vertical movement of chamber 1306 including that of electrode 1312. Below electrode 1312 is located a chamber 1330 which is connected to pump 1332 and valve 1334. Thus a generally downward flow of gas through chambers 1306 and 1330 is provided. The in situ plasma is provided by the application of appropriate voltages between electrodes 1312 and 1314. The voltage would be RF to provide the desired excitation to the gas in chamber 1306. Pump 1332 and valve 1334 provide the desired vacuum within chamber 1306. Thus the remote plasma from generator 1326 and the in situ plasma generated within the chamber 1306 are joined in acting on face 54. The distributor 1302 also has a slip fit with electrode 1312. Distributor 1302 extends along the vertical wall of chamber 1306. The process module 1300 is adapted to perform various processes.

After the desired operation is finished, the gas supplied through pipe 1322 is cut off, and the process module 1300 is pumped down to the same pressure as the rest of the process module ($10^{-3}$ Torr or less). A holding time may then be interposed, for thermal stabilization of the process module or for release of possible suspended particulates, and then the process module 1300 is opened and a transfer arm (not shown) removes the wafer from chamber 12.

Module 1300 includes the capability for process enhancement by in situ plasma and the capability is also provided for providing activated species, generated by gas flows through an additional plasma discharge which is remote from the wafer face to the wafer face. The module is shown in a process station 1300 which includes only one module and one vacuum load lock, but can also be used in embodiments where a central handling chamber is combined with plural process modules 1300 and one or more vacuum load lock chambers 12.

Note that a particulate sensor 202 is explicitly shown connected to the interior of the vacuum load lock chamber 12. This particulate sensor 202 need not be physically located very close to the docking position of vacuum wafer carrier 10, as long as the signal from particulate sensor 202 does provide an indication of the level of particulates present in the interior of the vacuum load lock chamber 12. The particulate sensor 202 is usefully located downstream from the vacuum load lock 12, in the pump out path (not shown). The particle sensor is, for example, a commercially available laser particle counter (which detects individual particles) combined with a counter which provides an output signal showing the number of particles counted over a certain time duration.

Module 1300 can perform processes described below for the etching of tungsten film, which is part of an overall process for manufacturing interconnects.

Figure 2A:
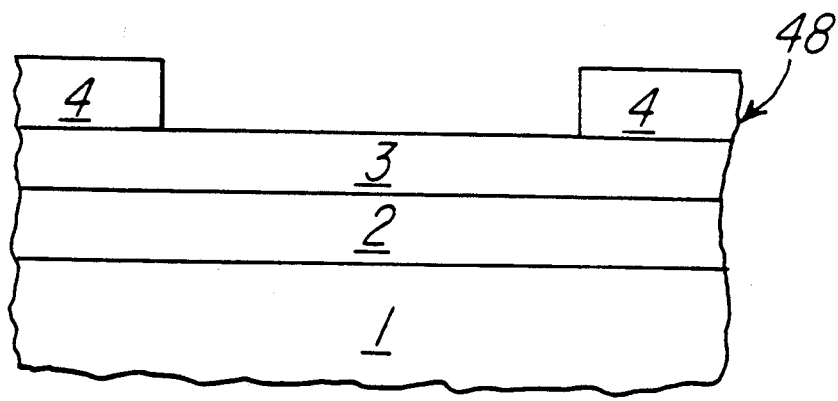
FIGS. 2(a), 2(b), and 2(c) show cross sectional views of a semiconductor wafer at successive manufacturing steps.
Figure 2B:
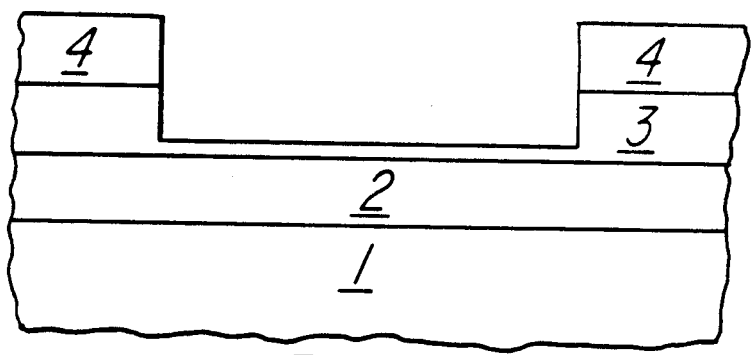
Figure 2C:
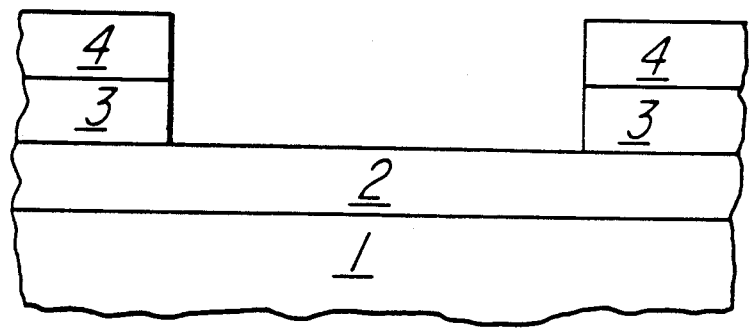

FIGS. 2(a), 2(b), and 2(c) show cross sectional views of a semiconductor wafer at successive manufacturing steps. FIG. 2(a) shows the wafer 48 having a substrate 1 (e.g. a crystalline silicon substrate) on which there is a layer of oxide 2 (e.g. silicon oxide). Atop this oxide layer is a layer of tungsten 3. As shown in FIG. 2(a), a patterned photoresist layer 4 has been formed on top of tungsten layer 3 using processes that are well known in the art.

A process utilizing fluorine and bromine-containing-gas activated species will anisotropically etch tungsten and as a result generate vertical walls. In general, these gasses etch anisotropically because a bromine sidewall passivant is formed on the sidewall of the etched trench while the fluorine etches the bottom of the trench at a much higher rate. Employing a combination of gasses that includes a separate fluorine and a separate bromine containing source provides, not only anisotropic etching, but also independent control of the etchants and potentially higher etch rates.

Activated species of the gas mixture described above would, however, provide little, if any, selectivity to a layer of photoresist. Thus, a resist selectivity enhancement gas, e.g. a hydrocarbon, can be added which reduces the photoresist etch rate, thus, improving selectivity to photoresist. In so doing, however, the etch rate of the tungsten can be slightly depressed because the amount of fluorine available to react with the tungsten can be reduced. In addition, some hydrocarbons may exhibit some pattern dependence, i.e., the tungsten etch rate could reduced in small areas as the flow rate of the hydrocarbon is increased. Such a hydrocarbon is suitable for large geometries.

In order to attain higher etch rates and still provide selectivity to the photoresist in small geometries a resist selectivity enhancement gas which would not consume fluorine would be useful in etching of the tungsten. Furthermore, enhancement of available bromine would increase sidewall passivation and add to the anisotropy of the etch process. One such resist selectivity enhancement is $CH_3Br$.

Any method which generates activated species from the gasses discussed above can be employed. The module 1300 described above can, therefore, be used to anisotropically etch the unmasked portions of the tungsten layer 3 on wafer 48 shown in FIG. 2(b) while providing improved selectivity to the photoresist layer 4. This process proceeds until a minimum amount of tungsten layer 3 as shown in FIG. 2(b) remains.

Vacuum wafer carrier 10 containing wafer 48 is placed into chamber 12. Chamber 12 is then pumped to a vacuum and the door (not shown) to vacuum wafer carrier 10 is then opened. A transfer arm (not shown) then removes the wafer 48 from the carrier and moves it to the process chamber 1306. Wafer 48 is placed on fingers 1320 by the transfer arm. The transfer arm is retracted from the process chamber 1306 and wafer 48 is placed in contact with electrode 1314 or an adjacent portion of process module 1300 as chamber 1306 closed by bellows 1316 as described above.

The desired process gasses, e.g. a fluorine containing, bromine containing and a hydrocarbon are then supplied via gas distributor ring 1304. Radio frequency voltage is impressed across electrodes 1312 and 1314, thereby generating an in-situ plasma within the process chamber 1306 from the desired process gasses. The radio frequency voltage generates activated species of the desired process gasses. Any other method which generates activated species could be employed including e.g. electron cyclotron resonance, chemically assisted ion beam, ion beam cluster, magnetron enhanced, LASER, x-ray, ultraviolet, and visible light. This process proceeds until a minimum amount of tungsten layer 3 as shown in FIG. 2(b) remains. When this desired thickness is achieved, the power to the electrodes 1312 and 1314 can be reduced and the desired process gasses turned off.

One useful process which yielded acceptable, although not optimized, results while etching the tungsten layer 3 using module 1300 used an RF power of 450 watts in the process chamber at 13.56 MHz. The gasses used were $SF_6$ at 40, HBr at 80, and $CH_3Br$ at 12 sccm. The pressure was 0.45 Torr.

In a second useful embodiment, the process step described above is combined with a second step which is a tungsten etch which is selective to oxide. Again a combination of a fluorine containing gas and a bromine containing gas are used to anisotropically etch the tungsten. In this case, however, selectivity is desired to the oxide layer 2. This is accomplished using a chlorine containing gas. The bromine containing gas in this embodiment forms not only a passivant on the sidewall of the trench but it also scavenges fluorine and chlorine and thereby assists in making the etch not only anisotropic, but also selective to oxide.

Therefore, in a second embodiment, if a module similar to module 1300 is used wafer 48 can remain in the process chamber and then the second process step can be performed. Otherwise it can be moved into module 1300 using a vacuum wafer carrier as described above.

When wafer 48 is then inside module 1300, the process gasses desired for the second step of the etch process, removal of remaining tungsten layer 3, are turned, e.g. $CCl_4$, $SF_6$, HBr, and if desired an inert gas are provided to the input to remote plasma generator 1326. If desired, the inert gas, e.g. argon, alone can be provided to the input of the remote plasma generator and the remainining desired process gasses can be added to the activated argon gas down stream of the remote plasma generator and prior to entry into the process chamber 1306 through an inlet in pipe 1322 (not shown). The remote plasma generator 1326 is activated and free radicals generated by it flow from the generator 1326 through pipe 1322 into chamber 1306 and to the face of the wafer 48. Radio frequency voltage is impressed across electrodes 1312 and 1314, thereby generating an in-situ plasma within the process chamber 1306 from the free radicals from pipe 1322. Any energy source described can be used to provide activated species from the free radicals. When the second step of the etch is complete, the power to the electrodes 1312 and 1314 and to the plasma generator 1326 is turned off and the gas flow to pipe 1322 is stopped. The bellows 1316 moves downward thereby opening the process chamber as described above, thus allowing the transfer arm to enter the process chamber 1306 and retrieve wafer 48 as described above. The transfer arm then returns the wafer 48 to the vacuum wafer carrier 10 in chamber 12 as described above. The resulting etched tungsten layer is shown in FIG. 2(c).

One useful process which yielded acceptable results while etching the tungsten layer 3 using module 1300 used an RF power in step 1 of 450 watts in the process chamber at 13.56 MHz. The gases used were $SF_6$ at 40, HBr at 80, and $CH_3Br$ at 12 sccm. The pressure was 0.45 Torr. The process found useful for the removal of the remainder of tungsten layer 3 using module 1300 used an RF power of 50 watts in the process chamber at 13.56 MHz and a 400 watts of microwave power at 2,450 MHz. The gases used were $SF_6$ at 40, HBr at 13, and $CCl_4$ at 45 sccm. The pressure was 0.3 Torr. If desired Argon can be fed through the remote plasma at 25 sccm, while adding $SF_6$ at 40, HBr at 13, and $CCl_4$ at 45 sccm at the output of the remote plasma generator 1326. Satisfactory results were obtained even though they had not been optimized for the particular conditions used, but they do show the synergistic advantage of combining these two effects with respect to both selectivity and etch rate as well as an increase in the efficiency of tungsten etching due sequential single wafer processing. The surface damage is minimized while the etch rate is improved. Additionally, the remote and in situ plasmas can be separately controlled. The resultant etch is anisotropic and selective. The level of anisotropy and selectivity is controlled by the relative RF plasma and microwave power levels, constituent process gasses as well as the pressure.

It should also be noted that the present invention is applicable to a tremendous variety of processes which are quite different in many respects from that described; for example, the present invention is perfectly well applicable to tungsten containing films on SOI materials, or to processes using trench transistors, as well as to the more conventional bulk-CMOS processes primarily described.

Unless specifically stated otherwise above the power and frequencies used for RF and microwave plasma can be widely varied, as can the other process parameters. The term low pressure as used herein indicates a pressure which is less than ambient pressure.

Following the etching of the tungsten layer 3 as shown in FIG. 2(c) the remaining photoresist 4 can be removed using well known techniques and additional processes are performed to complete the desired structure for example, a DRAM, SRAM, CMOS logic device etc.

Although silicon examples are shown herein wafers metal containing films on wafers made of other materials such as germanium, etc., can be etched. The wafers can be comprised of many different configurations, for example, a single piece of crystal material or small crystals located on a larger substrate. The plasma produced as disclosed herein will include free radicals. Although wafers such as wafer 48 are disclosed herein other types of flat workpieces could be used with the techniques disclosed herein.

The result of processing the wafer 48 can be electronic devices, for example, integrated circuits or discrete semiconductor devices. Once the processing is completed the wafers are divided into devices. The circuits and devices are enclosed into packages, for example, as shown in U.S. Pat. No. 4,465,898 issued to Orcutt et al on Aug. 14, 1984 and U.S. Pat. No. 3,439,238 issued to Birchler et al on Apr. 15, 1969, which are incorporated hereinto by reference. These packages are then utilized in the construction of printed circuit boards. The printer circuits boards, which cannot operate without the packaged integrated circuits and devices to perform their intended functions, are the required electrical components within computers, photocopiers, printers, telecommunication equipment, calculators, and all of the other electronic equipment which are an essential ingredients of the electronic and information age. Thus electronic equipment cannot function without these circuits and devices.

The present application describes a processing method, which contains numerous additional features which serve to provide further advantages.

It is an advantage of the present invention to provide a process which increases the selectivity of an etch process between tungsten and photoresist.

It is an advantage of the present invention to provide a process which increases the selectivity of an etch process between tungsten and oxide.

It is an advantage of the present invention to provide a process which allows improved control over the anisotropy of the etch.

It is an advantage of the present invention to provide a process which allows improved control over the anisotropy and selectivity of the etch by allowing the separate adjustment of the power utilized to generate the remote and in situ plasmas.

It is an advantage of the present invention to provide a process which utilizes separate control over the generation of in situ and remote plasma generation and which obtains a synergistic effect from utilizing both types of plasma.

Having described the invention in connection with certain specific embodiments thereof, it is to be understood that further modifications may now suggest themselves to those skilled in the art, it is intended to cover all such modifications as fall within the scope of the appended claims.

What is claimed is:

1. A method for etching a tungsten film from a workpiece in a processing chamber, the workpiece having a photoresist mask over the tungsten film, and a layer of silicon dioxide under the tungsten film, comprising, in the following order, the steps of:
   (a) generating activated species from a first gas including a flourine source, a bromine source and a halogenated hydrocarbon;
   (b) introducing the activated species of the first gas to the tungsten film;
   (c) substantially stopping the flow of the activated species of the first gas;
   (d) generating activated species from a second gas including a flourine source, a chlorine source and a bromine source in a chamber remote from the processing chamber;
   (e) introducing the activated species of the second gas to the tungsten film; and
   (f) generating additional activated species in the processing chamber from the activated species of the second gas.

2. The method of claim 1 wherein the generating of the activated species is accomplished by photolysis.

3. The method of claim 1 wherein the generating of the activated species is accomplished by electrolysis.

4. The method of claim 1 wherein the generating of the activated species is accomplished using an electromagnetic energy source.

5. The method of claim 1 wherein the generating of the activated species is accomplished using at least one electromagnetic energy source taken from the group consisting of radio frequency energy, electron cyclotron resonance, chemically assisted ion beam, ion beam cluster, magnetron enhanced, LASER, x-ray, ultraviolet, and visible light.

6. The method of claim 1 wherein the generating of the activated species of second gas is accomplished using an electromagnetic energy source.

7. The method of claim 1 wherein the generating of the activated species of second gas is accomplished using a microwave exciter.

8. A method for etching a tungsten film having a photoresist mask thereon, comprising introducing activated species from a gas mixture including $SF_6$, HBr and $CH_3Br$ into contact with the masked tungsten film, whereby the tungsten is etched at a greater rate than the resist.

9. A method for etching a tungsten film overlying a layer of silicon dioxide, said film having a photoresist mask thereon, comprising the steps of:
   (a) removing tungsten from unmasked areas of a workpiece using a first etchant including activated species of a gas mixture including $SF_6$, HBr and $CH_3Br$ to remove tungsten faster than resist; and
   (b) then removing tungsten from unmasked areas of the workpiece using a second etchant that removes tungsten at a greater rate than it removes the silicon dioxide.

10. A method as in claim 9 wherein the second etchant includes activated species of $SF_6$, HBr and $CCL_4$.

* * * * *